(12) United States Patent
Kimura

(10) Patent No.: US 12,165,713 B2
(45) Date of Patent: Dec. 10, 2024

(54) MEMORY SYSTEM

(71) Applicant: Kioxia Corporation, Tokyo (JP)

(72) Inventor: Naoki Kimura, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 169 days.

(21) Appl. No.: 17/896,828

(22) Filed: Aug. 26, 2022

(65) Prior Publication Data

US 2023/0307065 A1    Sep. 28, 2023

(30) Foreign Application Priority Data

Mar. 23, 2022    (JP) ................................. 2022-047537

(51) Int. Cl.

| G11C 16/30 | (2006.01) |
| G06F 13/16 | (2006.01) |
| G11C 5/14 | (2006.01) |
| G11C 16/04 | (2006.01) |
| G06F 3/06 | (2006.01) |
| G06F 13/14 | (2006.01) |
| G06F 13/42 | (2006.01) |
| G11C 11/4072 | (2006.01) |
| G11C 11/4074 | (2006.01) |

(52) U.S. Cl.
CPC .......... *G11C 16/30* (2013.01); *G06F 13/1668* (2013.01); *G11C 5/147* (2013.01); *G11C 16/0483* (2013.01); *G06F 3/0607* (2013.01); *G06F 3/0625* (2013.01); *G06F 3/0634* (2013.01); *G06F 3/0688* (2013.01); *G06F 13/14* (2013.01); *G06F 13/4221* (2013.01); *G11C 5/14* (2013.01); *G11C 11/4072* (2013.01); *G11C 11/4074* (2013.01)

(58) Field of Classification Search
CPC ..... G11C 16/30; G11C 5/147; G11C 11/4074; G11C 16/0483; G11C 5/14; G11C 11/4072; G11C 5/063; G11C 7/1084; G06F 13/1668; G06F 3/0607; G06F 3/0625; G06F 3/0634; G06F 3/0688; G06F 13/14; G06F 13/4221
See application file for complete search history.

(56) References Cited

U.S. PATENT DOCUMENTS

| 10,901,851 | B2 | 1/2021 | Batcheller et al. |
| 11,171,635 | B2 | 11/2021 | Chen et al. |
| 2011/0022789 | A1* | 1/2011 | Fujimoto ............... G06K 19/07 711/E12.001 |
| 2016/0070502 | A1* | 3/2016 | Matsumoto ........... G06F 3/0634 711/103 |

(Continued)

*Primary Examiner* — Huan Hoang
*Assistant Examiner* — Justin Bryce Heisterkamp
(74) *Attorney, Agent, or Firm* — Foley & Lardner LLP

(57) ABSTRACT

A memory system includes: a connector including a first terminal and a second terminal, each of which is capable of being connected to a host device; a non-volatile memory; and a controller connected between the connector and the non-volatile memory. The controller includes: a control circuit including a first node and a second node; a first signal line connected between the first terminal and the first node and capable of being pulled up to a first power level or a second power level; a second signal line connected to the second terminal; and a first resistance element including one end connected to the first signal line and the other end connected to the second signal line.

12 Claims, 8 Drawing Sheets

(56) References Cited

U.S. PATENT DOCUMENTS

| | | | |
|---|---|---|---|
| 2017/0264060 A1* | 9/2017 | Kimura | H01R 27/00 |
| 2021/0327871 A1 | 10/2021 | Gupta et al. | |
| 2022/0093156 A1* | 3/2022 | Matsumoto | G11C 5/147 |
| 2022/0291868 A1* | 9/2022 | Kimura | G06F 1/28 |

* cited by examiner

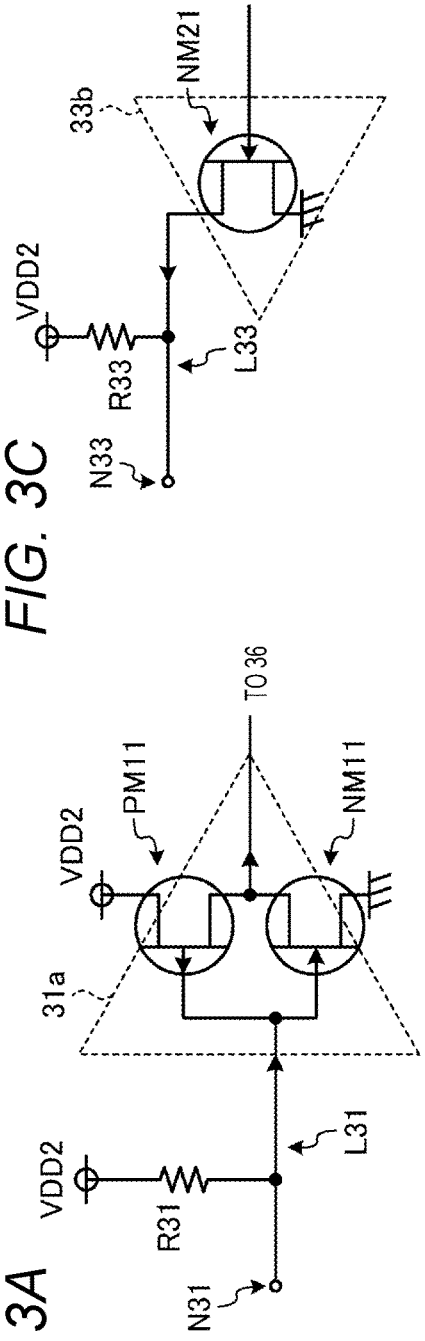
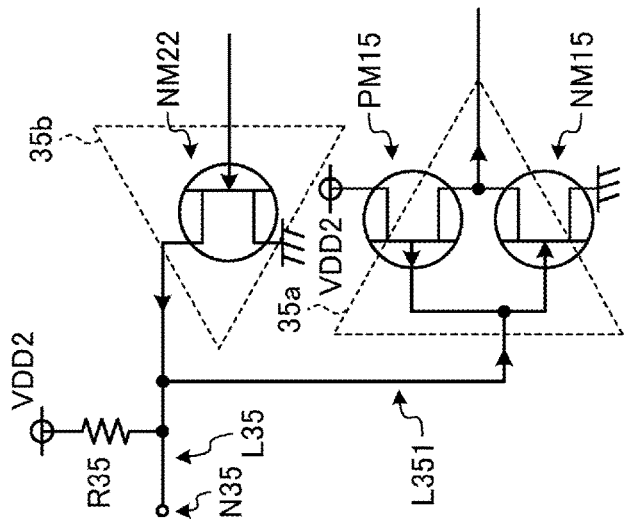
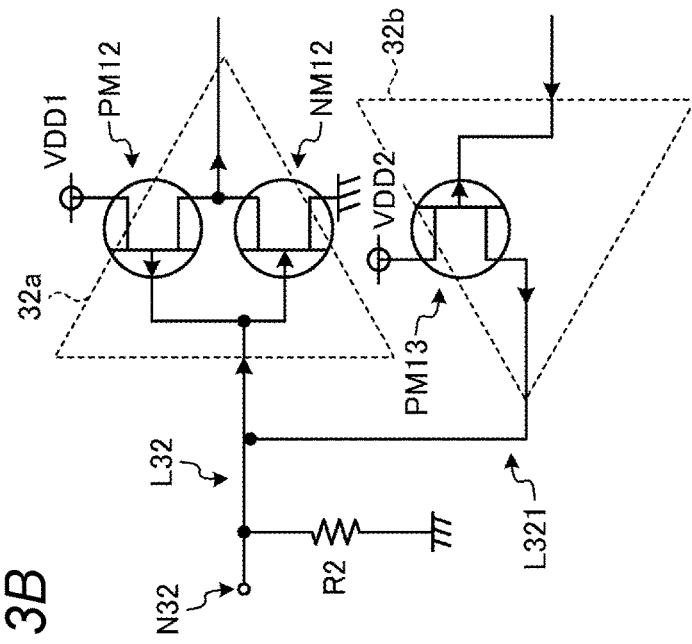
FIG. 3A
FIG. 3B
FIG. 3C
FIG. 3D

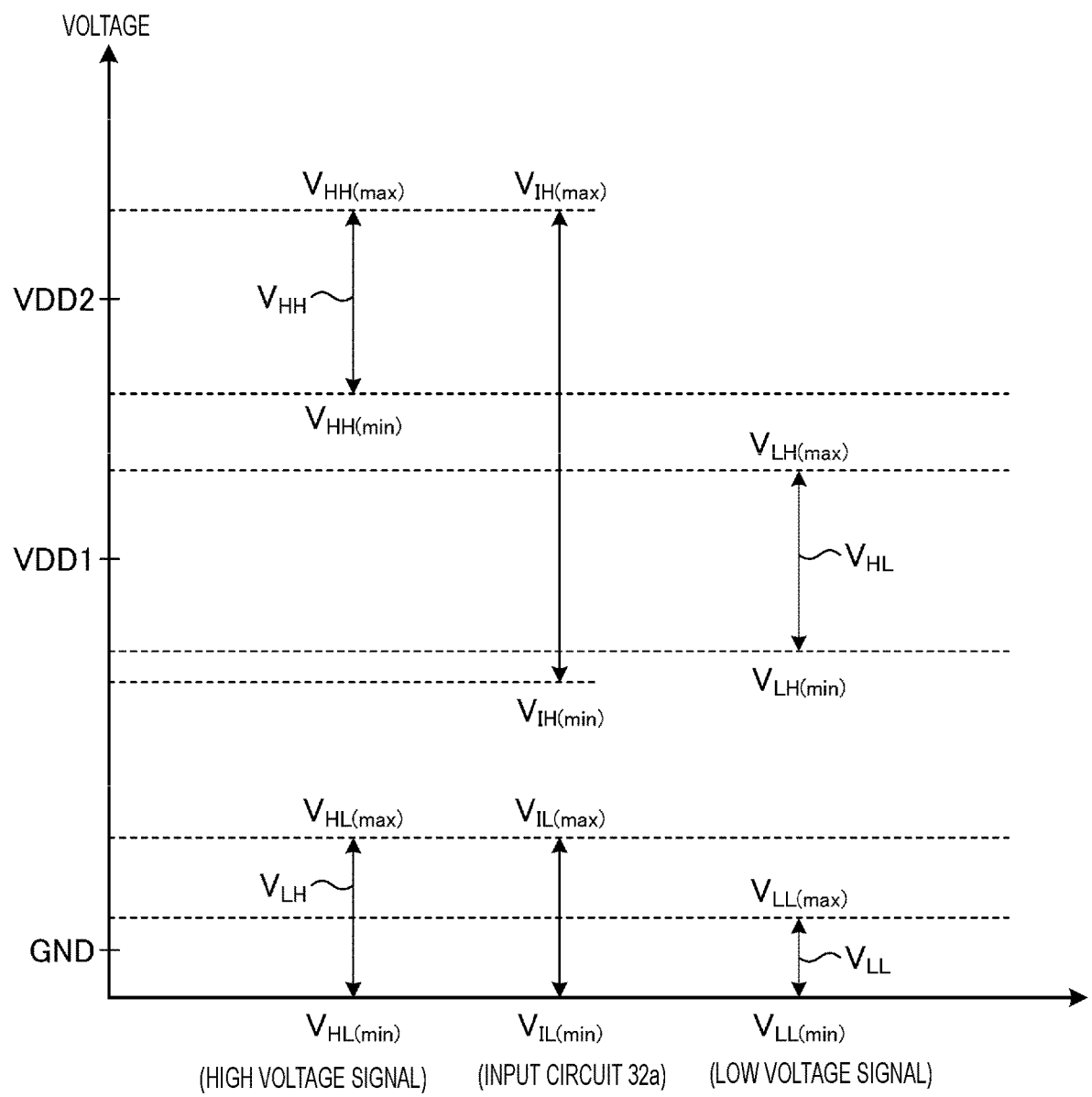

MEMORY SYSTEM

CROSS-REFERENCE TO RELATED APPLICATION(S)

This application is based upon and claims the benefit of priority from Japanese Patent Application No. 2022-047537, filed on Mar. 23, 2022, the entire contents of which are incorporated herein by reference.

FIELD

Embodiments described herein relate generally to a memory system.

BACKGROUND

A memory system that may be connected to a host device is known. The memory system includes a memory to which data is written, a controller connected to the memory and configured to control the memory, and a connector that is connected to the controller and may be connected to an external host device. The memory system is, for example, an SSD, and the memory is, for example, a non-volatile memory. Since the memory system corresponds to a low-voltage operation, it may be required to detect an input signal from the host device and switch to an appropriate voltage.

DESCRIPTION OF THE DRAWINGS

FIGS. 3A to 3D are circuit views illustrating a configuration of an input circuit and an output circuit of a controller of the memory system according to at least one embodiment.

FIG. 4 is a view illustrating a signal voltage range of an input/output circuit of the memory system according to at least one embodiment.

DETAILED DESCRIPTION

Embodiments provide a memory system capable of detecting an input signal from a host device and switching to an appropriate voltage.

In general, according to at least one embodiment, a memory system including a connector, a non-volatile memory, and a controller is provided. The connector includes a first terminal and a second terminal, each of which is capable of being connected to a host device. The controller is connected between the connector and the non-volatile memory. A peripheral circuit is connected between the connector and the controller. The controller includes a control circuit, a first signal line, a second signal line, and a first resistance element. The control circuit includes a first node and a second node. The first signal line is connected between the first terminal and the first node. The first signal line may be pulled up to a first power level or a second power level. The second signal line is connected to the second terminal. The first resistance element has one end connected to the first signal line, and the other end connected to the second signal line.

Hereinafter, descriptions will be made on a memory system according to embodiments in detail with reference to the drawings. The present disclosure is not limited to the embodiments.

EMBODIMENT

Figure 1A:
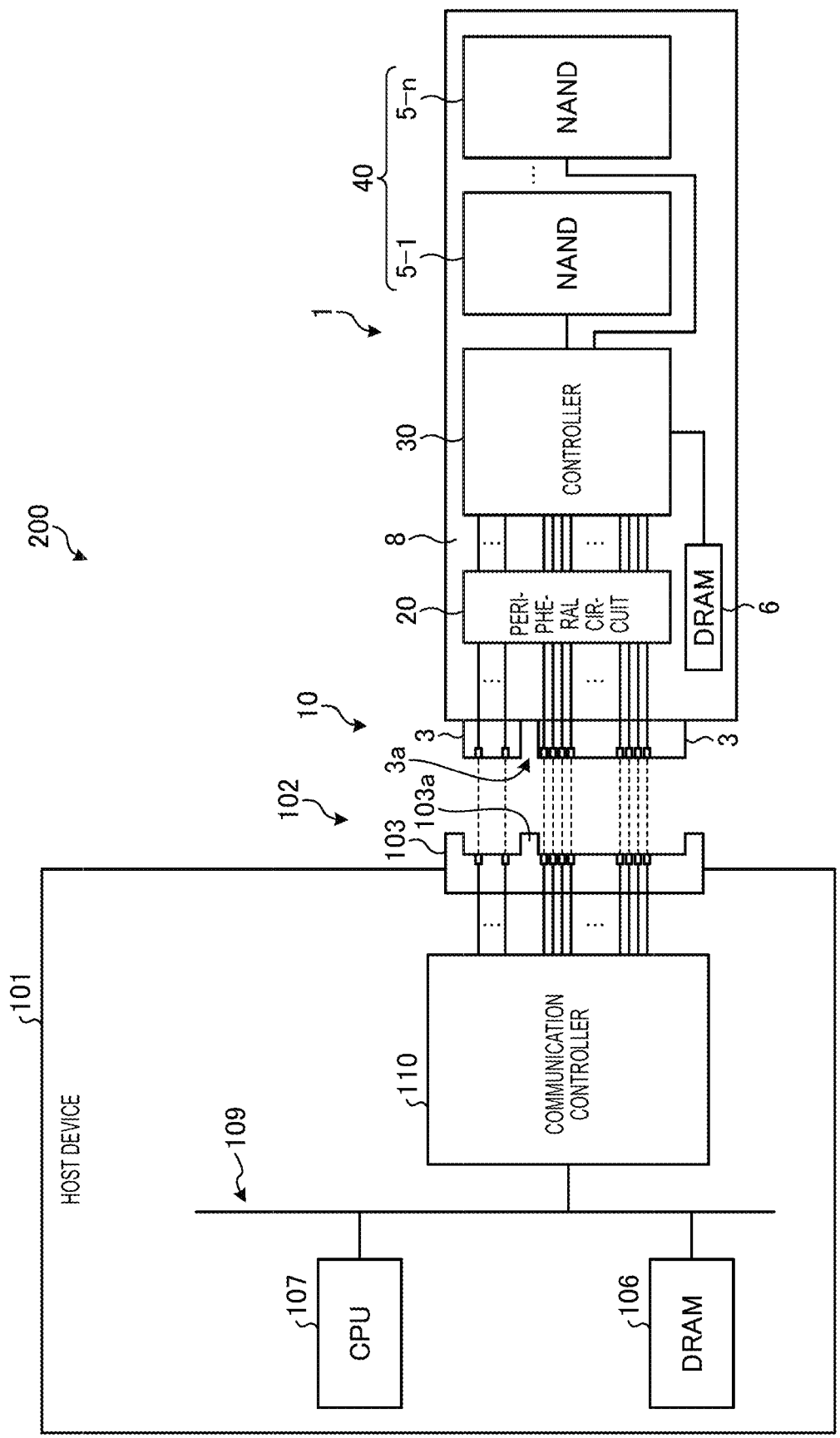
FIG. 1A is a block view illustrating an information processing system including a memory system according to at least one embodiment, and a host device connected to the memory system.
Figure 1B:
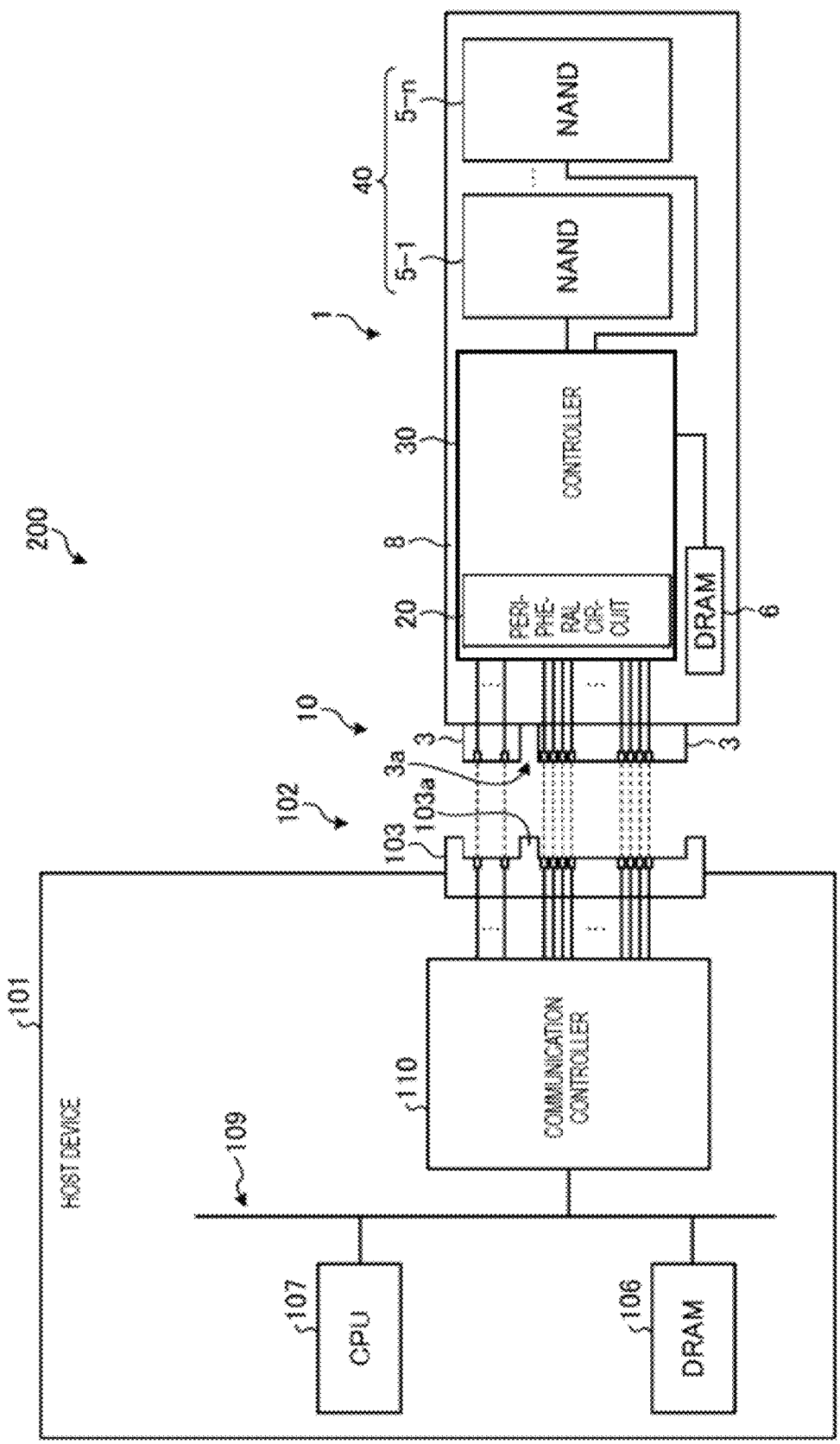
FIG. 1B is a block view illustrating another embodiment of the information processing system of FIG. 1A.

FIG. 1 (which includes FIGS. 1A and 1B alternatives) is a block view illustrating a configuration of an information processing system 200 including a memory system 1 according to at least one embodiment and a host device 101 that may be connected to the memory system 1. The information processing system 200 including the memory system 1 according to at least one embodiment may be configured as illustrated in FIG. 1.

The information processing system 200 includes the host device 101 and the memory system 1. In the information processing system 200, the memory system 1 may be communicably connected to the host device 101.

The host device 101 may be, for example, an information processing device such as a server or a personal computer, or a mobile terminal such as a tablet or a smart phone. Further, the host device 101 may be a game device, an imaging device, or an in-vehicle terminal such as a car navigation system.

The memory system 1 is, for example, a storage device such as a solid state drive (SSD). In the embodiment, the memory system 1 is assumed as, for example, a relatively small module, and an example of its external dimension (size) is 22 mm×80 mm. However, the size of the memory system 1 is not limited thereto.

The host device 101 includes a connector portion 102, and the memory system 1 includes a connector portion 10. The connector portion 10 may be disposed at the end portion of a substrate 8 so as to be configured as an edge connector 3. The connector portion 102 may be disposed on or at the end portion of a main board (mother board, not illustrated) of the host device 101 so as to be configured as a socket 103 corresponding to the edge connector 3.

The connector portion 10 on the memory system 1 side and the connector portion 102 on the host device 101 side have a shape according to a form factor standard (e.g., M.2 form factor). In the edge connector 3 of the connector portion 10, a notch 3a is formed at a position deviated from a central position along a direction in which the length of the substrate 8 is short. The position in the edge connector 3 where the notch 3a is formed may be, for example, a position of an "M key" in the M.2 form factor illustrated in FIG. 1, or a position of "B&M key" in the M.2 form factor (not illustrated). In the socket 103 of the connector portion 102, a projection 103a is formed at the position corresponding to the notch 3a of the edge connector 3.

The notch 3a and the projection 103a are configured to fit with each other when the edge connector 3 is connected to the socket 103.

Therefore, a desired form factor (e.g., M.2 form factor) is selected among a plurality of types of form factors, and the connector portion 10 of the memory system 1 of a desired type (e.g., type M corresponding to "M key", or type B+M corresponding to "B&M key") among a plurality of types of connectors according to a desired form factor standard is selected and connected to the connector portion 102 of the host device 101. Further, the positions where the notch 3a and the projection 103a are formed prevent the memory system 1 from being mounted upside down with respect to the host device 101.

In the edge connector 3 and the socket 103, a plurality of terminals corresponding to each other is disposed. When the edge connector 3 is connected to the socket 103, each of the terminals of the edge connector 3 is in contact with and electrically connected to the corresponding terminal of the socket 103. Therefore, the memory system 1 may be communicably connected to the host device 101.

In FIG. 1, the configuration in which the edge connector 3 is mounted as a physical connector is illustrated, but the edge connector 3 may be mounted as a terminal group, in which a pattern is plated, disposed in a shape according to the standard at the end portion of the substrate 8.

The host device 101 further includes a communication controller 110, a DRAM 106, a bus 109, and a CPU 107. The communication controller 110, the DRAM 106, and the CPU 107 are connected with each other via the bus 109. The CPU 107 collectively controls respective parts of the host device 101. The DRAM 106 may function as a buffer when transmitting/receiving a signal (e.g., a command or data) to/from the memory system 1, or functions as a working area of the CPU 107.

The memory system 1 further includes a peripheral circuit 20, a controller 30, a DRAM 6, and a non-volatile memory 40. The peripheral circuit 20 is electrically connected between the connector portion 10 and the controller 30. The peripheral circuit 20 may be mounted as, for example, a circuit in which a wiring is formed as a pattern of a copper foil formed on a substrate, and a resistor, a capacitor, an FET, or the like are provided. The controller 30 collectively controls respective parts of the memory system 1. The controller 30 may be mounted as a system-on-chip (SoC). The DRAM 6 may function as a buffer when transmitting/receiving a signal (e.g., a command or data) to/from the host device 101 or NAND memories 5-1 to 5-$n$, or functions as a working area of the controller 30. The non-volatile memory 40 includes, for example, a plurality of NAND flash memories (hereinafter, referred to as NAND memories) 5-1 to 5-$n$ ($n$ is an integer of 2 or more). Each of the NAND memories 5-1 to 5-$n$ stores data non-volatilely. The NAND memories 5-1 to 5-$n$ include a memory cell array in which a plurality of memory cells is arranged in a matrix, and each memory cell can store multiple values, for example, using an upper page and a lower page. The NAND memories 5-1 to 5-$n$ are configured with a plurality of memory chips, and in the NAND memories 5-1 to 5-$n$, data is erased in a block unit, and data writing and data reading are performed for each page. The block is configured by a plurality of pages.

When the connector portion 10 of the memory system 1 is connected to the connector portion 102 of the host device 101, the communication controller 110 becomes communicable with the controller 30 via the connector portion 102, the connector portion 10, and the peripheral circuit 20 in accordance with the control by the CPU 107. The communication controller 110 may transmit command/data or the like received from the CPU 107 via the bus 109 to the controller 30 via the connector portion 102, the connector portion 10, and the peripheral circuit 20. The controller 30 may write data to the NAND memories 5-1 to 5-$n$ or read data from the NAND memories 5-1 to 5-$n$ according to the command while using the DRAM 6 as a buffer memory, and then, transmit the response/data or the like to the communication controller 110. The communication controller 110 can receive the response/data or the like from the controller 30 via the peripheral circuit 20, the connector portion 10, and the connector portion 102, and transfer the received response/data or the like to the CPU 107 via the bus 109.

Figure 2:
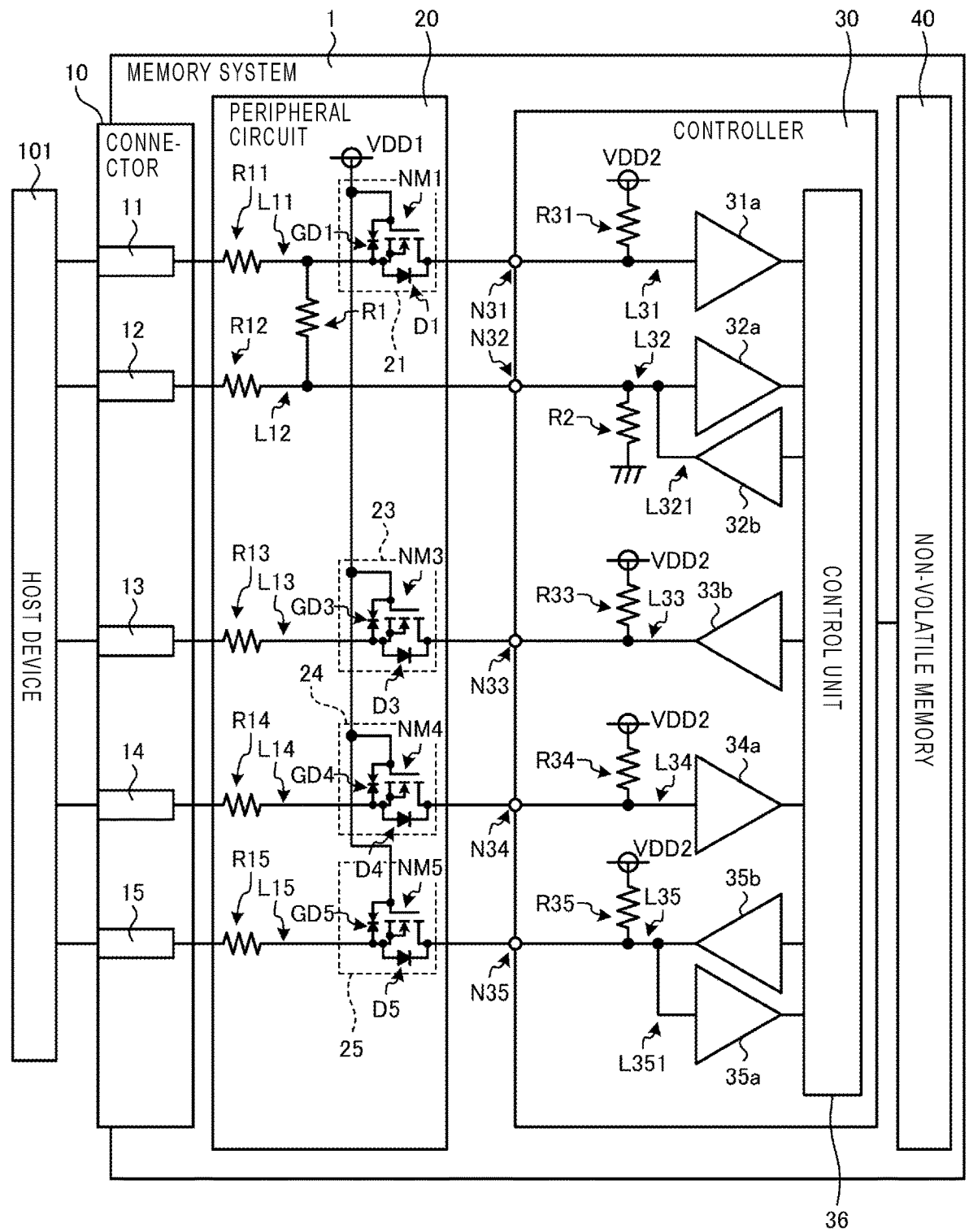
FIG. 2 is a block view illustrating a configuration of the memory system according to at least one embodiment.

FIG. 2 is a block view illustrating a configuration of the memory system 1 according to at least one embodiment. The memory system 1 is configured for the power level of the signal received from the host device 101 to be able to correspond to a plurality of different power levels.

The plurality of power levels include, for example, two power levels VDD1 and VDD2. For example, the power level VDD1 is 1.8 V, and the power level VDD2 is 3.3 V. Here, a signal corresponding to the lower power level VDD1 is referred to as a low voltage signal, and a signal corresponding to the high power level VDD2 is referred to as a high voltage signal.

The connector portion 10 illustrated in FIG. 2 includes a plurality of terminals 11 to 15. Each of the terminals 11 to 15 may be correspondingly connected to a plurality of terminals (not illustrated) in the socket 103 of the host device 101. Each of the terminals 11 to 15 may be mounted, for example, as a terminal of the edge connector 3 (see FIG. 1).

The terminal 11 is a terminal configured to receive a first signal from the host device 101. The first signal is, for example, a signal for notifying occurrence of a first event. The first event includes, for example, a shutdown. The first signal is a low-active signal, and is maintained at the H level when not notifying the occurrence of the first event, and is maintained at the L level when notifying the occurrence of the first event. The first signal is determined by the standard so that the memory system 1 side is pulled up to the power level in accordance with the voltage level of the control signal.

The terminal 12 is a terminal configured to receive a second signal from the host device 101. The second signal is, for example, a signal indicating whether or not the signal transmitted to and received from the host device 101 is a low voltage signal. The second signal is a high-active signal, and is maintained at the H level when the first to sixth signals transmitted to and received from the host device 101 are low voltage signals, and is maintained at the L level when the first to sixth signals transmitted to and received from the host device 101 are not low voltage signals (i.e., high voltage signals) since the second signal is not output from the host device 101 to the terminal 12.

The terminal 13 is a terminal configured to transmit the third signal to the host device 101. The third signal is, for example, a signal for notifying completion of an operation corresponding to the first event. The operation corresponding to the first event includes, for example, a data saving operation in response to the shutdown. The third signal is a low-active signal, and is maintained at the H level when not notifying the completion of the operation corresponding to the first event, is maintained at the L level when notifying the start of the operation corresponding to the first event, and is maintained again at the H level when notifying the completion of the first event.

The terminal 14 is a terminal configured to receive the fourth signal from the host device 101. The fourth signal is, for example, a signal for requesting an execution of a second event. The second event includes, for example, an initiation operation. The fourth signal is a low-active signal, and is maintained at the L level when requesting the execution of the second event, and is maintained at the H level when canceling the execution of the second event.

The terminal 15 is a terminal configured to transmit the fifth signal to the host device 101 and receive the sixth signal. The fifth signal is, for example, a signal for requesting an execution of a third event. The third event includes, for example, the supply of a high-speed clock signal. The fifth signal is a low-active signal, and is maintained at the L level when requesting the execution of the third event, and is maintained at the H level when not requesting the execution of the third event. The sixth signal is, for example, a signal related to the third event. The signal related to the third event includes, for example, canceling of a state where the high-speed clock signal is not supplied due to the stop of the third event. The sixth signal is a low-active signal, and cancels the state where the memory system 1 stops the communication having the high-speed clock signal as a reference by setting the fifth signal, which maintains the H level while the third event is stopped, to the L level.

The peripheral circuit 20 and the controller 30 may be operated, using the power level VDD2, but may correspond to the operation using the power level VDD1. The peripheral circuit 20 includes signal lines L11 to L15, level shifters 21 and 23 to 25, and resistance elements R1 and R11 to R15. The level shifters 21 and 23 to 25 include transistors NM1 and NM3 to NM5.

The controller 30 is mounted, for example, as a SoC, and includes electrodes N31 to N35 indicated by "o" in FIG. 2. In at least one embodiment, the electrodes N31 to N 35 are referred to as nodes N31 to N35 in a superordinate concept. The term "node" is not limited to an electrode, but may be a connection point on the line, any point on the line, the line itself, or an electrical connection element in any other form.

For example, the output of the peripheral circuit 20 and the input of the controller 30 may be directly connected, so that the controller 30 may input the output from the peripheral circuit 20 without using the electrode. In this case, the nodes N31 to N35 correspond to the output of the peripheral circuit 20 or the input of the controller 30. When the controller 30 is configured as a SoC and the peripheral circuit 20 is configured as a wiring on the substrate, the nodes N31 to N35 may be an electrode pad of the SoC. When the configuration including the peripheral circuit 20 and the controller 30 is configured as a SoC, there may be a circuit in which each of the peripheral circuit 20 and the controller 30 is mounted on the SoC, and the nodes N31 to N35 may be lines that connects the circuits to each other. Alternatively, when a configuration including the peripheral circuit 20 and the controller 30 is configured as a SoC, for example, a configuration including the peripheral circuit 20 and the controller 30 is configured as a package, there may be a chip in which each of the peripheral circuit 20 and the controller 30 is mounted in the package, and the nodes N31 to N35 may be bonding wires, ball electrodes, through silicon vias (TSV) or the like that connect the chips to each other. In the following, the case where the nodes N31 to N35 are electrodes will be illustrated.

Each terminal provided in the connector portion 10 is, normally, connected to the controller 30 via the peripheral circuit 20 or directly via wiring. As illustrated in FIG. 2, each of the terminals 11, 12, 13, 14, and 15 includes the nodes N31, N32, N33, N34, and N35 at locations connected to the controller 30 via the peripheral circuit 20. The signal line L11 is connected between the terminal 11 and the node N31. The resistance element R11 is disposed at a position on the terminal 11 side on the signal line L11. The transistor NM1 is disposed at a position between the resistance element R11 and the node N31 on the signal line L11. The signal line L11 may be pulled up to the power level VDD1 or the power level VDD2.

The transistor NM1 is, for example, an NMOS transistor, including a source connected to the resistance elements R1 and R11 via the signal line L11, and a drain connected to the node N31. The transistor NM1 includes a parasitic diode D1 and a gate protection diode GD1. In the parasitic diode D1, the anode is connected to the source of the transistor NM1 and the cathode is connected to the drain of the transistor NM1. In the gate protection diode GD1, one end is connected to the gate of the transistor NM1 and the other end is connected to the source of the transistor NM1.

The transistor NM1 can convert the level. When the L level of the low voltage signal is supplied to the signal line L11, the transistor NM1 is turned on, and transfers the L level to the node N31 of the controller 30. When the H level of the low voltage signal is supplied to the signal line L11, the transistor NM1 is turned off, and makes the node N31 side high impedance. The potential of the node N31 is pulled up by the resistance element R31, converted into the H level of the high voltage signal, and transmitted. When the L level of the high voltage signal is supplied to the signal line L11, the transistor NM1 is turned on, and transfers the L level to the node N31 of the controller 30. When the H level of the high voltage signal is supplied to the signal line L11, the transistor NM1 is turned off, and makes the node N31 side high impedance. The potential of the node N31 is pulled up by the resistance element R31, and transmitted as the H level of the high voltage signal.

The signal line L12 is connected between the terminal 12 and the node N32. The resistance element R12 is disposed at a position on the terminal 12 side on the signal line L12.

The signal line L13 is connected between the terminal 13 and the node N33. The resistance element R13 is disposed at a position on the terminal 13 side on the signal line L13. The transistor NM3 is disposed at a position between the resistance element R13 and the node N33 on the signal line L13.

The transistor NM3 is, for example, an NMOS transistor, including a source connected to the resistance elements R13 via the signal line L13, and a drain connected to the node N33. The transistor NM3 includes a parasitic diode D3 and a gate protection diode GD3. In the parasitic diode D3, the anode is connected to the source of the transistor NM3 and the cathode is connected to the drain of the transistor NM3. In the gate protection diode GD3, one end is connected to the gate of the transistor NM3 and the other end is connected to the source of the transistor NM3.

The transistor NM3 can convert the level. When the L level of the low voltage signal is supplied to the signal line L13, the transistor NM3 is turned on, and transfers the L level to the node N33 of the controller 30. When the H level of the low voltage signal is supplied to the signal line L13, the transistor NM3 is turned off, and makes the node N33 side high impedance. The potential of the node N33 is pulled up by the resistance element R33, converted into the H level of the high voltage signal and transmitted. When the L level of the high voltage signal is supplied to the signal line L13, the transistor NM3 is turned on, and transfers the L level to the node N33 of the controller 30. When the H level of the high voltage signal is supplied to the signal line L13, the transistor NM3 is turned off, and makes the node N33 side high impedance. The potential of the node N33 is pulled up by the resistance element R33, and transmitted as the H level of the high voltage signal.

The signal line L14 is connected between the terminal 14 and the node N34. The resistance element R14 is disposed at a position on the terminal 14 side on the signal line L14. The transistor NM4 is disposed at a position between the resistance element R14 and the node N34 on the signal line L14.

The transistor NM4 is, for example, an NMOS transistor, including a source connected to the resistance elements R14 via the signal line L14, and a drain connected to the node N34. The transistor NM4 includes a parasitic diode D4 and a gate protection diode GD4. In the parasitic diode D4, the anode is connected to the source of the transistor NM4 and the cathode is connected to the drain of the transistor NM4. In the gate protection diode GD4, one end is connected to the gate of the transistor NM4 and the other end is connected to the source of the transistor NM4.

The transistor NM4 can convert the level. When the L level of the low voltage signal is supplied to the signal line L14, the transistor NM4 is turned on, and transfers the L level to the node N34 of the controller 30. When the H level of the low voltage signal is supplied to the signal line L14, the transistor NM4 is turned off, and makes the node N34 side high impedance. The potential of the node N34 is pulled up by the resistance element R34, converted into the H level of the high voltage signal and transmitted. When the L level of the high voltage signal is supplied to the signal line L14, the transistor NM4 is turned on, and transfers the L level to the node N34 of the controller 30. When the H level of the high voltage signal is supplied to the signal line L14, the transistor NM4 is turned off, and makes the node N34 side high impedance. The potential of the node N34 is pulled up by the resistance element R34, and transmitted as the H level of the high voltage signal.

The signal line L15 is connected between the terminal 15 and the node N35. The resistance element R15 is disposed at a position on the terminal 15 side on the signal line L15. The transistor NM5 is disposed at a position between the resistance element R15 and the node N35 on the signal line L15.

The transistor NM5 is, for example, an NMOS transistor, including a source connected to the resistance elements R15 via the signal line L15, and a drain connected to the node N35. The transistor NM5 includes a parasitic diode D5 and a gate protection diode GD5. In the parasitic diode D5, the anode is connected to the source of the transistor NM5 and the cathode is connected to the drain of the transistor NM5. In the gate protection diode GD5, one end is connected to the gate of the transistor NM5 and the other end is connected to the source of the transistor NM5.

The transistor NM5 can convert the level. When the L level of the low voltage signal is supplied to the signal line L15, the transistor NM5 is turned on, and transfers the L level to the node N35 of the controller 30. When the H level of the low voltage signal is supplied to the signal line L15, the transistor NM5 is turned off, and makes the node N35 side high impedance. The potential of the node N35 is pulled up by the resistance element R35, converted into the H level of the high voltage signal and transmitted. When the L level of the high voltage signal is supplied to the signal line L15, the transistor NM5 is turned on, and transfers the L level to the node N35 of the controller 30. When the H level of the high voltage signal is supplied to the signal line L15, the transistor NM5 is turned off, and makes the node N35 side high impedance. The potential of the node N35 is pulled up by the resistance element R35, and transmitted as the H level of the high voltage signal.

The resistance element R1 is connected between the signal line L11 and the signal line L12. In the resistance element R1, one end is connected to the node between the resistance element R11 and the transistor NM1 on the signal line L11, and the other end is connected to the node between the resistance element R12 and the node N32 on the signal line L12. Therefore, the signal line L11 may be pulled up to the power level VDD1 or the power level VDD2 from the signal line L12 by the resistance element R1.

When the terminal 12 is at the H level corresponding to the power level VDD1 (e.g., 1.8 V), the controller 30 makes the node N32 high impedance. When the terminal 12 is at the L level, the controller 30 makes the node N32 the H level corresponding to the power level VDD2 (e.g., 3.3 V). Therefore, the signal line L11 is pulled up to the power level VDD1 when the terminal 12 is at the H level. The signal line L11 is pulled up to the power level VDD2 when the terminal 12 is at the L level.

The controller 30 further includes resistance elements R31, R2, R33, R34, and R35, input circuits 31a, 32a, 34a, and 35a, output circuits 32b, 33b, and 35b, and a control unit 36.

In the resistance element R31, one end is connected to the power level VDD2, and the other end is connected to a line L31. The line L31 connects the node N31 and an input node of the input circuit 31a. The resistance element R31 functions as a pull-up resistance so that the line L31 can be pulled up.

In the resistance element R2, one end is connected to the ground level, and the other end is connected to a line L32. The line L32 connects the node N32, an input node of the input circuit 32a, and an output node of the output circuit 32b. The resistance element R2 functions as a pull-down resistance so that the line L32 can be pulled down.

For example, when the line L32 is connected to the power level VDD2 via the pull-up resistance, it becomes difficult for the controller 30 to receive the H level of the low voltage signal from the host device 101. That is, the H level of the low voltage signal corresponds to the power level VDD1, but since the line L32 is pulled up to the power level VDD2, which is higher, the H level of the low voltage signal is not transmitted from the terminal 12 to the node N32 of the controller 30.

With regard to this, in the embodiment, since the line L32 is pulled down by the resistance element R2, it is easy for the controller 30 to receive the H level of the low voltage signal from the host device 101. That is, the H level of the low voltage signal corresponds to the power level VDD1, but since the line L32 is pulled down to the ground level, which is lower, the H level of the low voltage signal may be transmitted from the terminal 12 to the node N32 of the controller 30.

In the resistance element R33, one end is connected to the power level VDD2, and the other end is connected to a line L33. The line L33 connects the node N33 and an output node of the output circuit 33b. The resistance element R33 functions as a pull-up resistance so that the line L33 can be pulled up.

In the resistance element R34, one end is connected to the power level VDD2, and the other end is connected to a line L34. The line L34 connects the node N34 and an input node of the input circuit 34a. The resistance element R34 functions as a pull-up resistance so that the line L34 can be pulled up.

In the resistance element R35, one end is connected to the power level VDD2, and the other end is connected to a line L35. The line L35 connects the node N35 and an output node of the output circuit 35b and an input node of the input circuit 35a. The resistance element R35 functions as a pull-up resistance so that the line L35 can be pulled up.

The input circuit 31a is connected between the node N31 and the control unit 36. In the input circuit 31a, the input node is connected to the node N31 and the resistance element R31 via the line L31, and the output node is connected to the control unit 36.

FIGS. 3A to 3D are circuit views illustrating the configuration of the input circuit and the output circuit of the controller 30 of the memory system 1 according to the embodiment. As illustrated in FIG. 3A, the input circuit 31a may be configured as a push-pull type. The input circuit 31a includes a transistor NM11 and a transistor PM11. The transistor NM11 and the transistor PM11 are inverter-connected between the node N31 and the control unit 36. The transistor NM11 is, for example, an NMOS transistor, including a source connected to a reference level (e.g., ground level). The transistor PM11 is, for example, a PMOS transistor, including a source connected to the power level VDD2. In the transistor NM11 and the transistor PM11, the gates are commonly connected to constitute the input node, and the drains are commonly connected to constitute the output node.

In the input circuit 31a illustrated in FIG. 2, when the node N31 receives the signal at the H level, the transistor PM11 is turned off and the transistor NM11 is turned on, so that the L level is output to the control unit 36. In the input circuit 31a, when the node N31 receives the signal at the L level, the transistor PM11 is turned on and the transistor NM11 is turned off, so that the H level is output to the control unit 36.

Each of the input circuit 32a and the output circuit 32b is connected between the node N32 and the control unit 36. In the input circuit 32a, the input node is connected to the node N32 and the resistance element R2 via the line L32, and the output node is connected to the control unit 36. In the output circuit 32b, the input node is connected to the control unit 36, and the output node is connected to the node N32 and the resistance element R2 via lines L321 and L32. In the line L321, one end is connected to the line L32, and the other end is connected to the output node of the output circuit 32b.

As illustrated in FIG. 3B, the input circuit 32a may be configured as a push-pull type, and the output circuit 32b may be configured as an open-drain type.

The input circuit 32a may be configured as a push-pull type. The input circuit 32a includes a transistor NM12 and a transistor PM12. The transistor PM12 is, for example, a PMOS transistor, including a source connected to the power level VDD1. In aspects other than that, the input circuit 32a is configured similar to the input circuit 31a illustrated in FIG. 3A.

In the input circuit 32a, when the node N32 receives the signal at the H level, the transistor PM12 is turned off and the transistor NM12 is turned on, so that the L level is output to the control unit 36. In the input circuit 32a, when the node N32 receives the signal at the L level, the transistor PM12 is turned on and the transistor NM12 is turned off, so that the H level is output to the control unit 36.

The output circuit 32b may be configured as an open-drain type. The output circuit 32b includes a transistor PM13. The transistor PM13 is, for example, a PMOS transistor, including a source connected to the power level VDD2, a drain connected to the node N32 and the resistance element R2 via the line L32, and a gate connected to the control unit 36.

In the output circuit 32b, when receiving the signal at the L level from the control unit 36, the transistor PM13 is turned on, so that the H level is output to the node N32. In the output circuit 32b, when receiving the signal at the H level from the control unit 36, the transistor PM13 is turned off, so that the node N32 is made high impedance.

The output circuit 33b illustrated in FIG. 2 is connected between the node N33 and the control unit 36. In the output circuit 33b, the input node is connected to the control unit 36, and the output node is connected to the node N33 and the resistance element R33 via the line L33.

As illustrated in FIG. 3C, the output circuit 33b may be configured as an open-drain type. The output circuit 33b includes a transistor NM21. The transistor NM21 is, for example, an NMOS transistor, including a source connected to the reference level (e.g., ground level), a drain connected to the node N33 and the resistance element R33 via the line L33, and a gate connected to the control unit 36.

In the output circuit 33b, when receiving the signal at the H level from the control unit 36, the transistor NM21 is turned on, so that the node N33 is drawn to the L level. In the output circuit 33b, when receiving the signal at the L level from the control unit 36, the transistor NM21 is turned off, so that the node N33 is made high impedance.

The input circuit 34a illustrated in FIG. 2 is connected between the node N34 and the control unit 36. In the input circuit 34a, the input node is connected to the node N34 and the resistance element R34 via the line L34, and the output node is connected to the control unit 36.

The input circuit 34a may be configured as a push-pull type as illustrated in FIG. 3A.

Each of the output circuit 35b and the input circuit 35a illustrated in FIG. 2 is connected between the node N35 and the control unit 36. In the output circuit 35b, the input node is connected to the control unit 36, and the output node is connected to the node N35 and the resistance element R35 via the line L35. In the input circuit 35a, the input node is connected to the node N35 and the resistance element R35 via lines L351 and L35, and the output node is connected to the control unit 36. In the line L351, one end is connected to the line L35, and the other end is connected to the input node of the input circuit 35a.

As illustrated in FIG. 3D, the output circuit 35b may be configured as an open-drain type, and the input circuit 35a may be configured as a push-pull type.

The output circuit 35b may be configured as an open-drain type as illustrated in FIG. 3C.

In the output circuit 35b, when receiving the signal at the H level from the control unit 36, the transistor NM22 is turned on, so that the node N35 is drawn to the L level. In the output circuit 35b, when receiving the signal at the L level from the control unit 36, the transistor NM22 is turned off, so that the node N35 is made high impedance.

The input circuit 35a may be configured as a push-pull type as illustrated in FIG. 3A.

In the input circuit 35a, when the signal at the H level is received from the node N35, the transistor PM15 is turned off and the transistor NM15 is turned on, so that the L level is output to the control unit 36. In the input circuit 35a, when the signal at the L level is received from the node N35, the transistor PM15 is turned on and the transistor NM15 is turned off, so that the H level is output to the control unit 36.

FIG. 4 is a view illustrating a signal voltage range of an input/output circuit of the memory system according to the embodiment. As illustrated in FIG. 4, the input circuit 32a is set such that the circuit threshold voltage thereof can correspond to both the low voltage signal and the high voltage signal.

For example, the low voltage signal has a voltage range corresponding to the power level VDD1. In the low voltage signal, the voltage range of the H level $V_{LH}$ is a voltage range $V_{LH}$(min) to $V_{LH}$(max) including the power level VDD1 (e.g., 1.8 V), and the voltage range of the L level $V_{LL}$ is a voltage range $V_{LL}$(min) to $V_{LL}$(max) including the ground level GND. For example, the upper limit of the H level $V_{LH}$ may be 1.95 V, the lower limit of the H level $V_{LH}$ may be 1.7 V, the upper limit of the L level $V_{LL}$ may be VDD1×0.3=0.54 V, and the lower limit of the L level $V_{LL}$ may be −0.3 V.

For example, the high voltage signal has a voltage range corresponding to the power level VDD2. The high voltage signal may take a voltage range. In the high voltage signal, the voltage range of the H level $V_{HH}$ is a voltage range $V_{HH}$(min) to $V_{HH}$(max) including the power level VDD2 (e.g., 3.3 V), and the voltage range of the L level $V_{HL}$ is a voltage range $V_{HL}$(min) to $V_{HL}$(max) including the ground level GND. For example, the upper limit of the H level $V_{HH}$ may be 3.456 V, the lower limit of the H level $V_{HH}$ may be 2.7 V, the upper limit of the L level $V_{HL}$ may be VDD2×0.25=0.825 V, and the lower limit of the L level $V_{HL}$ may be −0.3 V.

The input circuit 32a has an operation voltage range that can correspond both the low voltage signal and the high voltage signal. The input circuit 32a has a voltage range $V_{IH}$(min) to $V_{IH}$(max) of the H level $V_{IH}$. The voltage range $V_{IH}$(min) to $V_{IH}$(max) of the H level $V_{IH}$ of the input circuit 32a includes the voltage range $V_{LH}$(min) to $V_{LH}$(max) of the H level $V_{LH}$ of the low voltage signal and the voltage range $V_{HH}$(min) to $V_{HH}$(max) of the H level $V_{HH}$ of the high voltage signal. The upper limit of the H level $V_{IH}$ of the input circuit 32a may be 3.456 V, and the lower limit of the H level $V_{LH}$ may be VDD2×0.5=1.65 V.

The input circuit 32a has a voltage range $V_{IL}$(min) to $V_{IL}$(max) of the L level $V_{IL}$. The voltage range $V_{IL}$(min) to $V_{IL}$(max) of the L level $V_{IL}$ of the input circuit 32a includes the voltage range $V_{LL}$(min) to $V_{LL}$(max) of the L level $V_{LL}$ of the low voltage signal and the voltage range $V_{HL}$(min) to $V_{HL}$(max) of the L level $V_{HL}$ of the high voltage signal. The upper limit of the L level $V_{IL}$ of the input circuit 32a may be VDD2×0.25=0.825 V, and the lower limit of the L level $V_{LH}$ may be −0.3 V.

The voltage range of other input circuits 31a, 34a, and 35a may be equal to the voltage range of the high voltage signal.

Figure 5:
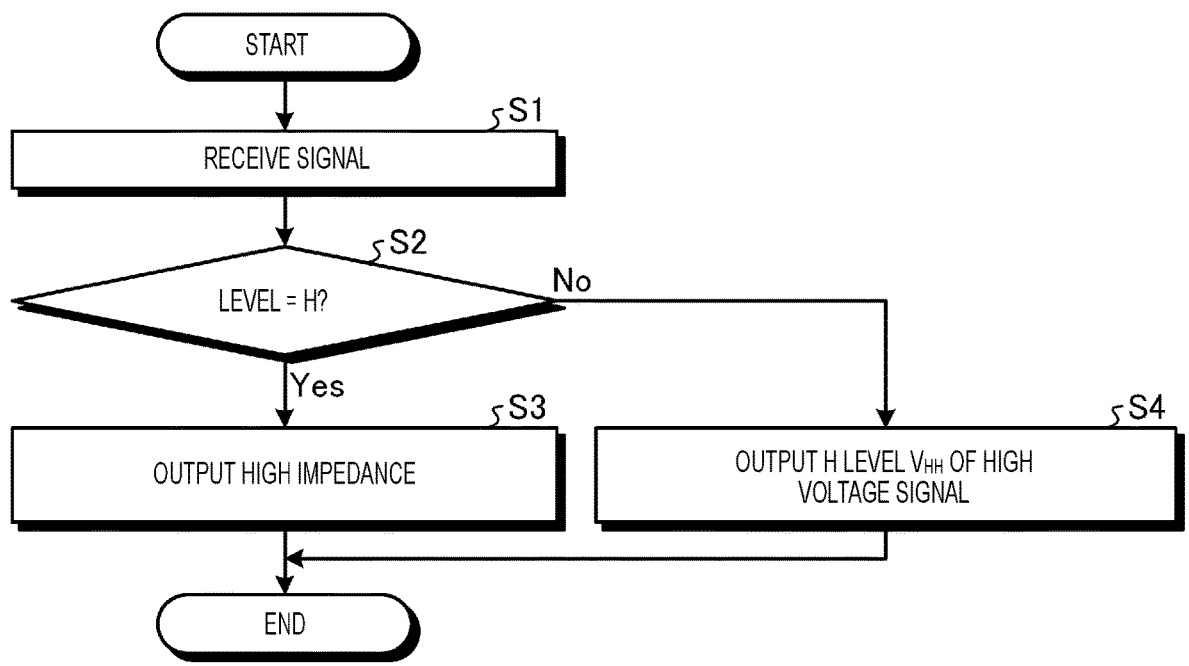
FIG. 5 is a flowchart illustrating an operation of the memory system according to at least one embodiment.
Figure 6A:
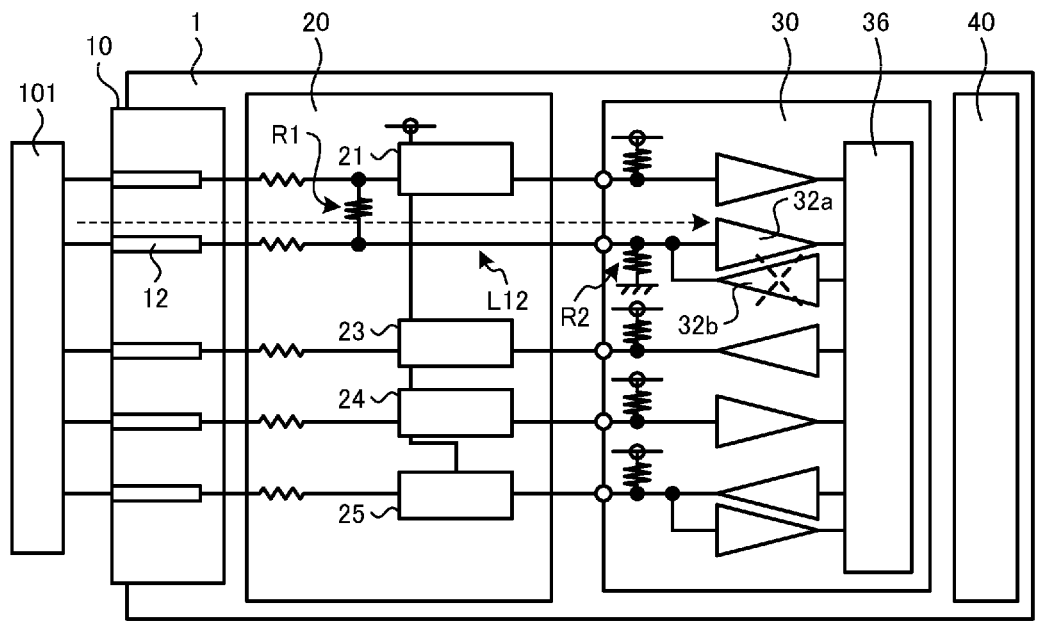
FIGS. 6A and 6B are views illustrating an operation of the memory system according to at least one embodiment.
Figure 6B:
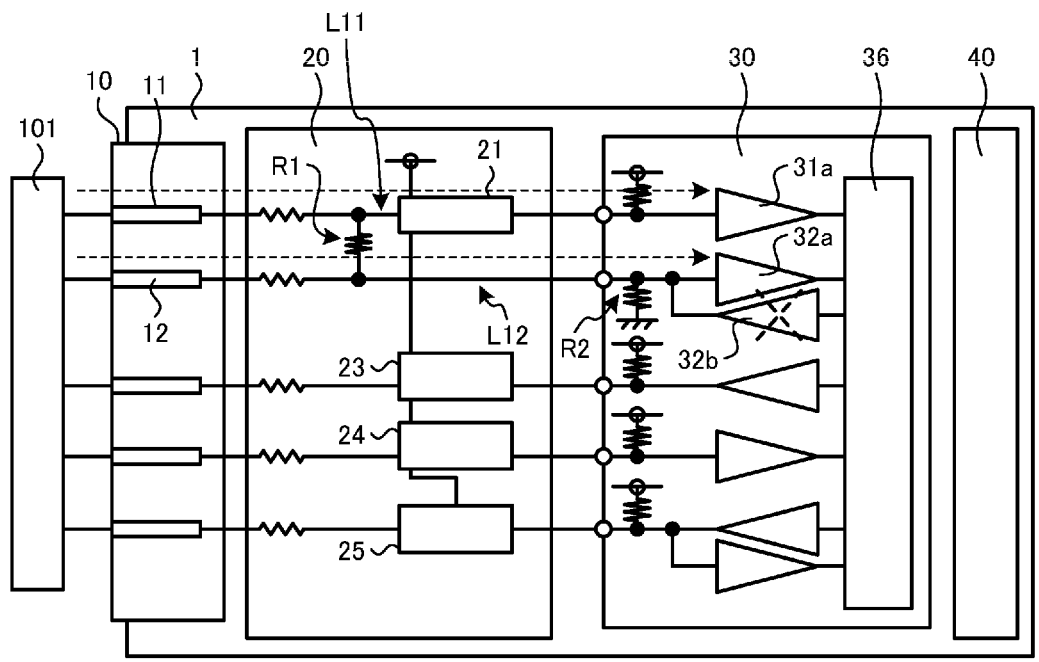
Figure 7A:
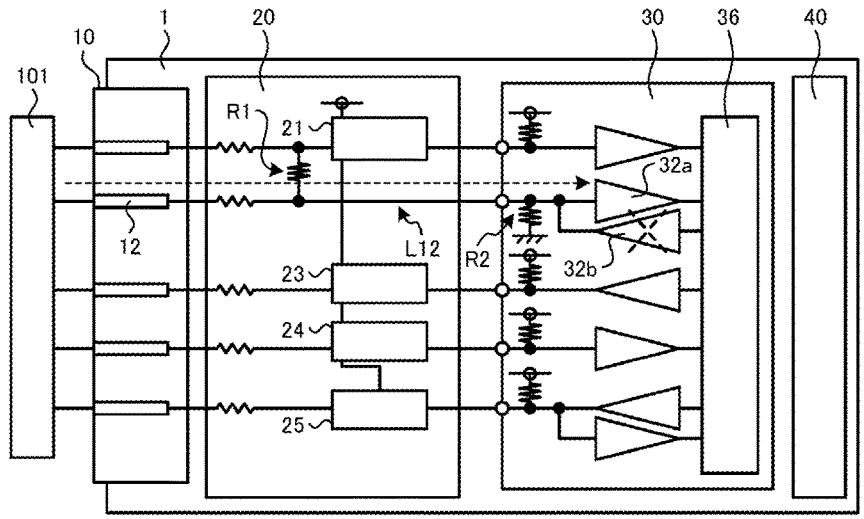
FIGS. 7A to 7C are views illustrating an operation of the memory system according to at least one embodiment.
Figure 7B:
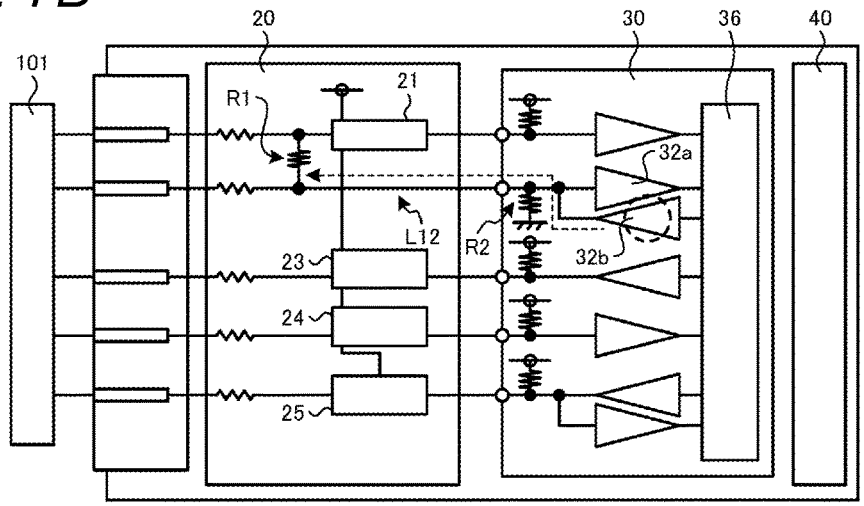
Figure 7C:
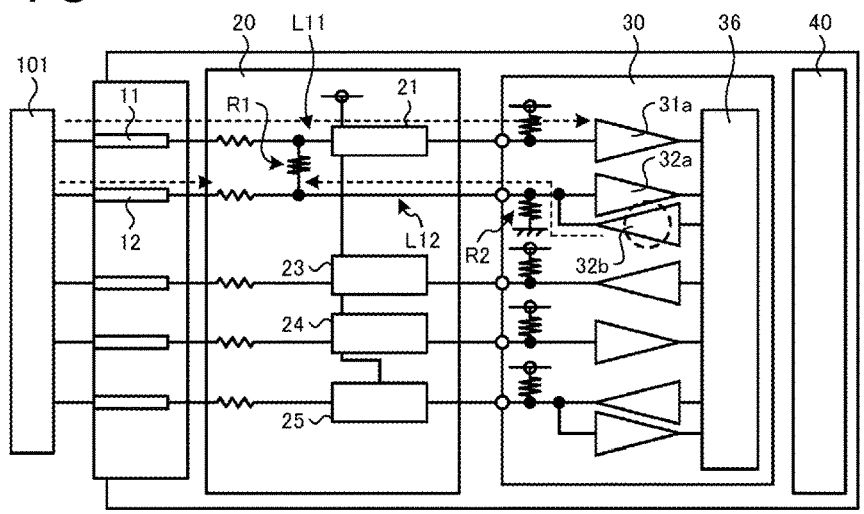

FIG. 5 is a flowchart illustrating an operation of the memory system according to at least one embodiment. FIGS. 6A and 6B are views illustrating an operation of the memory system 1 according to at least one embodiment. FIGS. 6A and 6B illustrate the operation in a case where the signal line L11 of the peripheral circuit 20 is pulled up to the power level VDD1. FIGS. 7A to 7C are views illustrating an operation of the memory system 1 according to at least one embodiment. FIGS. 7A to 7C illustrate the operation in a case where the signal line L11 of the peripheral circuit 20 is pulled up to the power level VDD2. The operation of the memory system 1 will be described with reference to FIGS. 5 to 7C.

In the memory system 1, the controller 30 receives a signal indicating whether or not the signal to be sent by the host device 101 is the low voltage signal from the host device 101 (S1), and confirms whether or not the level of the signal is the H level (S2).

For example, as illustrated in FIGS. 6A and 7A, the control unit 36 of the controller 30 receives the second signal from the host device 101 via the terminal 12, the signal line L12, the input circuit 32a and determines whether or not the level of the second signal is the H level in accordance with the output of the input circuit 32a. The second signal is a high-active signal, and is maintained at the H level when the first to sixth signals transmitted to and received from the host device 101 are low voltage signals, and is maintained at the L level when the first to sixth signals transmitted to and received from the host device 101 are not low voltage signals (i.e., high voltage signals) since the host device 101 does not output the second signal. At this time, the control unit 36 turns off the output circuit 32b, and thus, the output node of the output circuit 32b is made high impedance. That is, the control unit 36 supplies the H level to the gate of the transistor PM13 of the output circuit 32b illustrated in FIG. 3B, and the transistor PM13 is maintained at the OFF-state. Therefore, the drain of the transistor PM13 is maintained at high impedance.

Returning to FIG. 5, when the level of the signal received in S1 is the H level (Yes in S2), the controller 30 outputs high impedance (S3). Therefore, the peripheral circuit 20 pulls up the signal line L11 to the power level VDD1.

For example, as illustrated in FIG. 6B, in response to the second signal being the H level, the control unit 36 of the controller 30 maintains the output circuit 32b in an OFF-state, and maintains the output node of the output circuit 32b at high impedance. That is, the controller 30 outputs high impedance to the signal line L12. Therefore, in the resistance element R1, one end receives the second signal having the H level $V_{LH}$ (i.e., H level $V_{LH}$ of the low voltage signal) corresponding to the power level VDD1, and thus, the signal line L11 connected to the other end may be pulled up to the power level VDD1. Therefore, the host device 101 may transmit the low voltage signal to the terminal 11, the peripheral circuit 20 may receive the low voltage signal via the terminal 11, and the control unit 36 of the controller 30 may receive the low voltage signal via the terminal 11, the signal line L11, and the input circuit 31a.

Returning to FIG. 5, when the level of the signal received in S1 is the L level (No in S2), the controller 30 outputs the H level $V_{HH}$ (S4). The H level $V_{HH}$ is the H level $V_{HH}$ of the high voltage signal, and has the voltage range according to the power level VDD2 (see FIG. 4). Therefore, the peripheral circuit 20 pulls up the signal line L11 to substantially the power level VDD2.

For example, as illustrated in FIG. 7B, in response to the second signal being the L level, the control unit 36 of the controller 30 turns on the output circuit 32b, and maintains the output node of the output circuit 32b at the H level $V_{HH}$. That is, the controller 30 outputs the H level $V_{HH}$ of the high voltage signal to the signal line L12. Therefore, in the resistance element R1, one end receives the signal having the H level corresponding to the power level VDD2 from the output circuit 32b. Thus, the signal line L11 connected to the other end may be pulled up to the power level VDD2. Therefore, as illustrated in FIG. 7C, the host device 101 may transmit the high voltage signal to the terminal 11, the peripheral circuit 20 may receive the high voltage signal via the terminal 11, and the control unit 36 of the controller 30 may receive the high voltage signal via the terminal 11, the signal line L11, and the input circuit 31a.

As described above, in at least one embodiment, in the peripheral circuit 20 of the memory system 1, the signal line L11 and the signal line L12 are connected with each other via the resistance element R1. In this configuration, the controller 30 receives the second signal from the host device 101 via the signal line L12. The second signal goes to the H level when the host device 101 is required to transmit/receive the low voltage signal, and goes to the L level when the host device 101 is required to transmit/receive the high voltage signal. The controller 30 outputs high impedance to the signal line L12 when the second signal is the H level $V_{LH}$ (corresponding to the power level VDD1), and outputs the H level $V_{HH}$ (corresponding to the power level VDD2) to the signal line L12 when the second signal is L level. Therefore, the host device 101 may pull up the signal line L11 to the power level VDD1 or the power level VDD2 in accordance with the signal that the host device 101 will transmit.

In at least one embodiment, the configuration in which the peripheral circuit 20 is disposed outside the controller 30 is illustrated, but the peripheral circuit 20 may be disposed inside the controller 30 as shown, for example, in FIG. 1B. In this case, the nodes N31 to N35 may be electrodes, and the nodes N31 to N35 may be other than the electrodes (e.g., line itself). Further, when the peripheral circuit 20 is disposed inside the controller 30, the controller 30 includes the signal lines L11 to L15, the level shifters 21 and 23 to 25, the resistance elements R1 and R11 to R15, the electrodes N31 to N35, the resistance elements R31, R2, R33, R34, and R35, the input circuits 31a, 32a, 34a, and 35a, the output circuits 32b, 33b, and 35b, and the control unit 36.

For example, when a voltage switching circuit is additionally provided between the signal line L12 and the controller 30 in order to pull up the signal line L11 to the power level VDD1 or the power level VDD2, the circuit size on the connector portion 10 side of the peripheral circuit 20 may increase, and thus, the cost of the peripheral circuit 20 may increase.

With regard to this, in at least one embodiment, the signal line L11 can be pulled up to the power level VDD1 or the power level VDD2 without additionally providing the voltage switching circuit, and thus, the increase of the cost of the peripheral circuit 20 may be reduced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
    a connector including a first terminal and a second terminal, each of the first terminal and the second capable of being connected to a host device;
    a non-volatile memory; and
    a controller connected between the connector and the non-volatile memory,
    wherein the controller includes:
        a control circuit, the control circuit including a first node and a second node;
        a first signal line connected between the first terminal and the first node, the first signal line capable of being pulled up to a first power level or a second power level;
        a second signal line connected to the second terminal; and
        a first resistance element including one end connected to the first signal line and a remaining end connected to the second signal line.

2. The memory system according to claim 1, wherein the second signal line is connected between the second terminal and the second node.

3. The memory system according to claim 2, wherein the control circuit further includes a second resistance element, the second resistance element including one end connected to the second node and a remaining end connected to a reference level.

4. The memory system according to claim 3, wherein the control circuit further includes a third resistance element, the third resistance element including one end connected to the first node and a remaining end connected to the second power level.

5. The memory system according to claim 2, wherein the control circuit is configured to:
    set the second node to a high impedance when the second terminal is at the first power level, and
    set the second node at the second power level when the second terminal is at a reference level.

6. The memory system according to claim 5, wherein the control circuit further includes:
    a push-pull input circuit connected to the second node, and
    an open-drain type output circuit connected to the second node.

7. The memory system according to claim 1, wherein the controller is mounted on a system on chip.

8. The memory system according to claim 1, wherein the non-volatile memory includes a NAND memory.

9. An information processing system comprising:
    the memory system of claim 1; and
    a host device connected to the memory system.

10. The information processing system according to claim 9, wherein the host device includes at least one of a server, a personal computer, a tablet or a smart phone.

11. The information processing system according to claim 9, wherein the connector of the memory system includes an edge connector arranged to contact a socket of the host device.

12. The information processing system according to claim 9, wherein the controller includes a peripheral circuit electrically connected to the connector.

* * * * *